(12) United States Patent
Silverbrook

(10) Patent No.: US 7,465,030 B2
(45) Date of Patent: *Dec. 16, 2008

(54) NOZZLE ARRANGEMENT WITH A MAGNETIC FIELD GENERATOR

(75) Inventor: Kia Silverbrook, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 0 days.

This patent is subject to a terminal disclaimer.

(21) Appl. No.: 12/050,938

(22) Filed: Mar. 18, 2008

(65) Prior Publication Data

US 2008/0158302 A1 Jul. 3, 2008

Related U.S. Application Data

(63) Continuation of application No. 11/754,367, filed on May 29, 2007, now Pat. No. 7,364,271, which is a continuation of application No. 10/982,763, filed on Nov. 8, 2004, now Pat. No. 7,240,992, which is a continuation of application No. 09/864,379, filed on May 25, 2001, now Pat. No. 6,814,429, which is a continuation of application No. 09/112,767, filed on Jul. 10, 1998, now Pat. No. 6,416,167.

(30) Foreign Application Priority Data

Jul. 15, 1997 (AU) ..................................... PO7991
Mar. 25, 1998 (AU) ..................................... PP2592

(51) Int. Cl.
 *B41J 2/04* (2006.01)
(52) U.S. Cl. ......................................... 347/54; 347/56

(58) Field of Classification Search .................... 347/54, 347/56, 61–65, 67, 94
See application file for complete search history.

(56) References Cited

U.S. PATENT DOCUMENTS

| 4,423,401 | A | 12/1983 | Mueller ....................... 337/107 |
| 4,553,393 | A | 11/1985 | Ruoff ............................. 60/528 |
| 4,672,398 | A | 6/1987 | Kuwabara et al. ............. 347/48 |
| 4,737,802 | A | 4/1988 | Mielke .......................... 347/54 |

(Continued)

FOREIGN PATENT DOCUMENTS

DE 1648322 A 3/1971

(Continued)

OTHER PUBLICATIONS

Ataka, Manabu et al, "Fabrication and Operation of Polymide Bimorph Actuators for Ciliary Motion System". Journal of Microelectromechanical Systems, US, IEEE Inc. New York, vol. 2, No. 4, Dec. 1, 1993, pp. 146-150, XP000443412, ISSN: 1057-7157.

(Continued)

*Primary Examiner*—Juanita D Stephens

(57) ABSTRACT

The invention provides for a nozzle arrangement for a printhead. The arrangement includes a wafer substrate defining a nozzle chamber, and a passivation layer formed on the substrate to define a roof wall and ink ejection port of the chamber. The arrangement also includes a paddle arranged in the chamber configured to operatively eject ink from the chamber via the ejection port, as well as a magnetic field generator fast with the wafer substrate, the generator configured to actuate the paddle to eject the ink.

8 Claims, 13 Drawing Sheets

U.S. PATENT DOCUMENTS

| | | | |
|---|---|---|---|
| 4,864,824 A | 9/1989 | Gabriel et al. | 60/527 |
| 4,914,562 A | 4/1990 | Abe et al. | 347/63 |
| 4,937,676 A | 6/1990 | Finelli et al. | 348/375 |
| 5,029,805 A | 7/1991 | Albarda et al. | 251/11 |
| 5,113,204 A | 5/1992 | Miyazawa et al. | 347/68 |
| 5,258,774 A | 11/1993 | Rogers | 347/40 |
| 5,398,131 A | 3/1995 | Hall et al. | 359/465 |
| 5,467,118 A | 11/1995 | Gragg et al. | 347/87 |
| 5,666,141 A | 9/1997 | Matoba et al. | 347/54 |
| 5,719,604 A | 2/1998 | Inui et al. | 347/54 |
| 5,792,249 A | 8/1998 | Shirota et al. | 106/31.27 |
| 5,812,159 A | 9/1998 | Anagnostopoulos et al. | 347/55 |
| 5,872,582 A * | 2/1999 | Pan | 347/65 |
| 5,992,994 A | 11/1999 | Rasmussen et al. | 347/104 |
| 6,247,796 B1 * | 6/2001 | Silverbrook | 347/54 |
| 6,988,788 B2 | 1/2006 | Silverbrook | 347/54 |

FOREIGN PATENT DOCUMENTS

| | | |
|---|---|---|
| DE | 2905063 | 8/1980 |
| DE | 3245283 A | 6/1984 |
| DE | 3430155 A | 2/1986 |
| DE | 3716996 A | 12/1988 |
| DE | 3934280 A | 4/1990 |
| DE | 4328433 A | 3/1995 |
| DE | 19516997 A | 11/1995 |
| DE | 19517969 A | 11/1995 |
| DE | 19532913 A | 3/1996 |
| DE | 19623620 A1 | 12/1996 |
| DE | 19639717 A | 4/1997 |
| EP | 0092229 A | 10/1983 |
| EP | 0382044 A2 | 8/1990 |
| EP | 0398031 A | 11/1990 |
| EP | 0398295 A2 | 11/1990 |
| EP | 0427291 A | 5/1991 |
| EP | 0431338 A | 6/1991 |
| EP | 0478956 A | 4/1992 |
| EP | 0506232 A | 9/1992 |
| EP | 0510648 A | 10/1992 |
| EP | 0627314 A | 12/1994 |
| EP | 0634273 A2 | 1/1995 |
| EP | 0713774 A2 | 5/1996 |
| EP | 0737580 A | 10/1996 |
| EP | 0750993 A | 1/1997 |
| EP | 0763930 A1 | 3/1997 |
| EP | 0882590 A | 12/1998 |
| FR | 2231076 | 12/1974 |
| GB | 792145 A | 3/1958 |
| GB | 1428239 A | 3/1976 |
| GB | 2262152 A | 6/1993 |
| JP | 58-112747 A | 7/1983 |
| JP | 58-116165 A | 7/1983 |
| JP | 61-025849 A | 2/1986 |
| JP | 61-268453 A | 11/1986 |
| JP | 01-105746 A | 4/1989 |
| JP | 01-115639 A | 5/1989 |
| JP | 01-128839 A | 5/1989 |
| JP | 01-257058 A | 10/1989 |
| JP | 01-306254 A | 12/1989 |
| JP | 02-050841 A | 2/1990 |
| JP | 02-092643 A | 4/1990 |
| JP | 02-108544 A | 4/1990 |
| JP | 02-158348 A | 6/1990 |
| JP | 02-162049 A | 6/1990 |
| JP | 02-265752 A | 10/1990 |
| JP | 03-065348 A | 3/1991 |
| JP | 03-112662 A | 5/1991 |
| JP | 03-180350 A | 8/1991 |
| JP | 04-001051 A | 1/1992 |
| JP | 04-118241 A | 4/1992 |
| JP | 04-126225 A | 4/1992 |
| JP | 04-141429 A | 5/1992 |
| JP | 04-353458 A | 12/1992 |
| JP | 04-368851 A | 12/1992 |
| JP | 05-284765 A | 10/1993 |
| JP | 05-318724 A | 12/1993 |
| JP | 06-091865 A | 4/1994 |
| JP | 06-091866 A | 4/1994 |
| JP | 07-314665 A | 12/1995 |
| JP | 2001-092255 A | 4/2001 |
| JP | 2001-096760 A | 4/2001 |
| WO | WO 94/18010 A | 8/1994 |
| WO | WO 95/16323 | 6/1995 |
| WO | WO 96/32265 A | 10/1996 |
| WO | WO 97/12689 A | 4/1997 |

OTHER PUBLICATIONS

Noworolski J M et al: "Process for in-plane and out-of-plane single-crystal-silicon thermal microactuators" Sensors And Actuators A, Ch. Elsevier Sequoia S.A., Lausane, vol. 55, No. 1, Jul. 15, 1996, pp. 65-69, XP004077979.

Yamagata, Yutaka et al, "A Micro Mobile Mechanism Using Thermal Expansion and its Theoretical Analysis". Proceedings of the workshop on micro electro mechanical systems (MEMS), US, New York, IEEE, vol. Workshop 7, Jan. 25, 1994, pp. 142-147, XP000528408, ISBN: 0-7803-1834-X.

* cited by examiner

NOZZLE ARRANGEMENT WITH A MAGNETIC FIELD GENERATOR

RELATED AND CROSS REFERENCED PATENT APPLICATIONS

This application is a Continuation Application of U.S. Ser. No. 11/754,367 filed on May 29, 2007, now U.S. Pat. No. 7,364,271, which is a Continuation Application of U.S. Ser. No. 10/982,763 filed Nov. 8, 2004, now U.S. Pat. No. 7,240,992 which is a Continuation Application of U.S. Ser. No. 09/864,379 filed May 25, 2001, now U.S. Pat. No. 6,814,429, which is a Continuation application of U.S. application Ser. No. 09/112,767, filed Jul. 10, 1998, now U.S. Pat. No. 6,416,167.

U.S. patent application Ser. Nos. 6,227,652 6,213,589 6,247,795 6,394,581 6,244,691 6,220,694 6,257,705 6,247,793 6,241,342 6,234,611 6,283,582 6,239,821 6,338,547 6,557,977 6,362,843 6,227,653 6,234,609 6,238,040 6,188,415 6,227,654 6,209,989 6,247,791 6,336,710 6,416,167 6,243,113 6,260,953 are hereby incorporated by reference.

FIELD OF THE INVENTION

This invention relates to an ink jet printhead incorporating a back flow prevention mechanism.

BACKGROUND OF THE INVENTION

The Applicant has invented a printhead chip which is capable of printing text and images at a resolution of up to 1600 dpi. While developing this technology, the Applicant has filed many patent applications covering various inventions which have been conceived during this development.

A large proportion of the inventions are in the field of micro electro-mechanical systems. These systems allow up to 84000 nozzle arrangements to be formed on a single printhead chip. As a result of various constraints arising from a necessity for the high density of nozzle arrangements, it has been necessary to design the systems in such a way that each nozzle arrangement, in most cases, includes one or more moving parts which serve to eject ink from each of the nozzle chambers defined by the nozzle arrangements.

In most cases, these moving parts or components act on the ink within a nozzle chamber to eject that ink from the nozzle chamber. The Applicant has identified a particular difficulty to be overcome in the manufacture of such printheads. This has to do with the back flow of ink which is highly undesirable. The back flow of ink usually occurs after an ink drop has been ejected from a particular nozzle arrangement where a resulting break off of the drop and "suck back" of the ink into the nozzle chamber causes this back flow. Further, this back flow can also arise as a result of the operation of ink ejection mechanisms of such printheads. Many of the ink ejection mechanisms that the applicant has developed incorporate a reciprocal movement of one or more components. This reciprocal movement of the components can result in a back flow of ink as the components return to a start condition once a drop has been ejected.

It will be appreciated that since the ink is physically ejected from each nozzle arrangement by the movement of the nozzle components it is extremely important that a consistent and correct amount of ink be supplied to each of the nozzle chambers. The back flow which can result in the absence of any mechanism to prevent it can disturb the fine balance required to achieve the accurate supply of ink to the various nozzle arrangements.

Attempts have been made to address the problem of back flow in other forms of printheads such as thermal ink jet printheads. An example of such an attempt is indicated in FIG. 1 of the drawings. Here, reference numeral 1 generally indicates part of a thermal ink jet printhead incorporating a back flow prevention mechanism. This printhead 1 includes an actuator in the form of a heater 2 which is positioned in a substrate 3 defining a floor 4 of a nozzle chamber 5. An ink ejection port 6 is positioned above the heater 2. The heater 2 heats ink 7 to an extent which is such that the ink 7 is ejected from the ejection port 6. It will readily be appreciated that back flow of the ink in this case would inhibit the ejection of the ink 7 due to the loss of the required ejection pressure. Thus, a passive flap 8 is positioned in the chamber 5. The flap 8 is configured to bend towards a roof 9 of the nozzle chamber 5 when acted upon by the ink 7, thereby obstructing a possible back flow of ink.

This form of back flow prevention device is not suitable for an ink jet printhead of the type described in this specification. The primary reason for this is that the operation of the device is dependent upon the heating of the ink. This form of printhead does not utilize the heating of ink to operate. Further, Applicant has found that it is highly advantageous to incorporate a back flow prevention device in an actuator mechanism so that a number of moving components can be kept to a minimum.

The Applicant has conceived the present invention to at least reduce the level of back flow occurring once ink has been ejected from the nozzle chamber, while maintaining a suitably low level of energy consumption.

SUMMARY OF THE INVENTION

According to a first aspect of the invention, there is provided an ink jet printhead which comprises a substrate that defines a plurality of ink inlets;

a drive circuitry layer positioned on the substrate; and a plurality of nozzle arrangements arranged on the substrate, each nozzle arrangement comprising a nozzle chamber structure positioned on the substrate and defining a nozzle chamber in fluid communication with a respective ink inlet, and an ink ejection port in fluid communication with the nozzle chamber;

an actuator connected to the drive circuitry layer and displaceable with respect to the substrate on receipt of an electrical signal from the drive circuitry layer; and an ink ejection member operatively positioned with respect to the nozzle chamber and displaceable when the actuator is displaced such that ink is ejected from the ink ejection port, wherein the ink ejection member is configured so that the ink ejection member obstructs a flow of ink from the nozzle chamber into the inlet at a certain position in a displacement path of the ink ejection member.

The ink jet printhead may be the product of an integrated circuit fabrication technique, the substrate being in the form of a wafer substrate and the nozzle arrangements being formed in a deposition and etching process.

The nozzle chamber structure may include side walls and a roof wall that defines the ink ejection port.

Each ink ejection member may be positioned in a respective nozzle chamber between the ink ejection port and the inlet.

Each ink ejection member may be substantially planar and may be dimensioned to span the inlet.

Each ink ejection member may be dimensioned to correspond generally with cross sectional dimensions of the nozzle chamber.

Instead, each ink ejection member may be mounted on the substrate and may define a closure for the inlet. The ink ejection member may be movable towards an operative position in which the ink ejection member both closes the inlet and ejects ink from the nozzle chamber and an inoperative position in which the inlet is open.

According to a second aspect of the invention, there is provided an ink jet printhead which comprises a substrate; and at least one nozzle arrangement arranged on the substrate, the, or each, nozzle arrangement comprising side walls and a roof wall that define a nozzle chamber and an inlet in fluid communication with the nozzle chamber; and an actuator that includes an ink ejection mechanism, the actuator being operable to activate the ink ejection mechanism so that the ink ejection mechanism is displaceable between a quiescent condition and an operative condition such that ink is ejected from the nozzle chamber while the ink ejection mechanism is so displaced, wherein the ink ejection mechanism is configured so that, at some point between and including the quiescent and operative conditions, the ink ejection mechanism serves to obstruct a possible flow path from the nozzle chamber and into the inlet.

The invention is now described, by way of example, with reference to the accompanying drawings. The specific nature of the following description should not be construed as limiting the scope of the above summary.

DETAILED DESCRIPTION OF THE DRAWINGS

Figure 1:
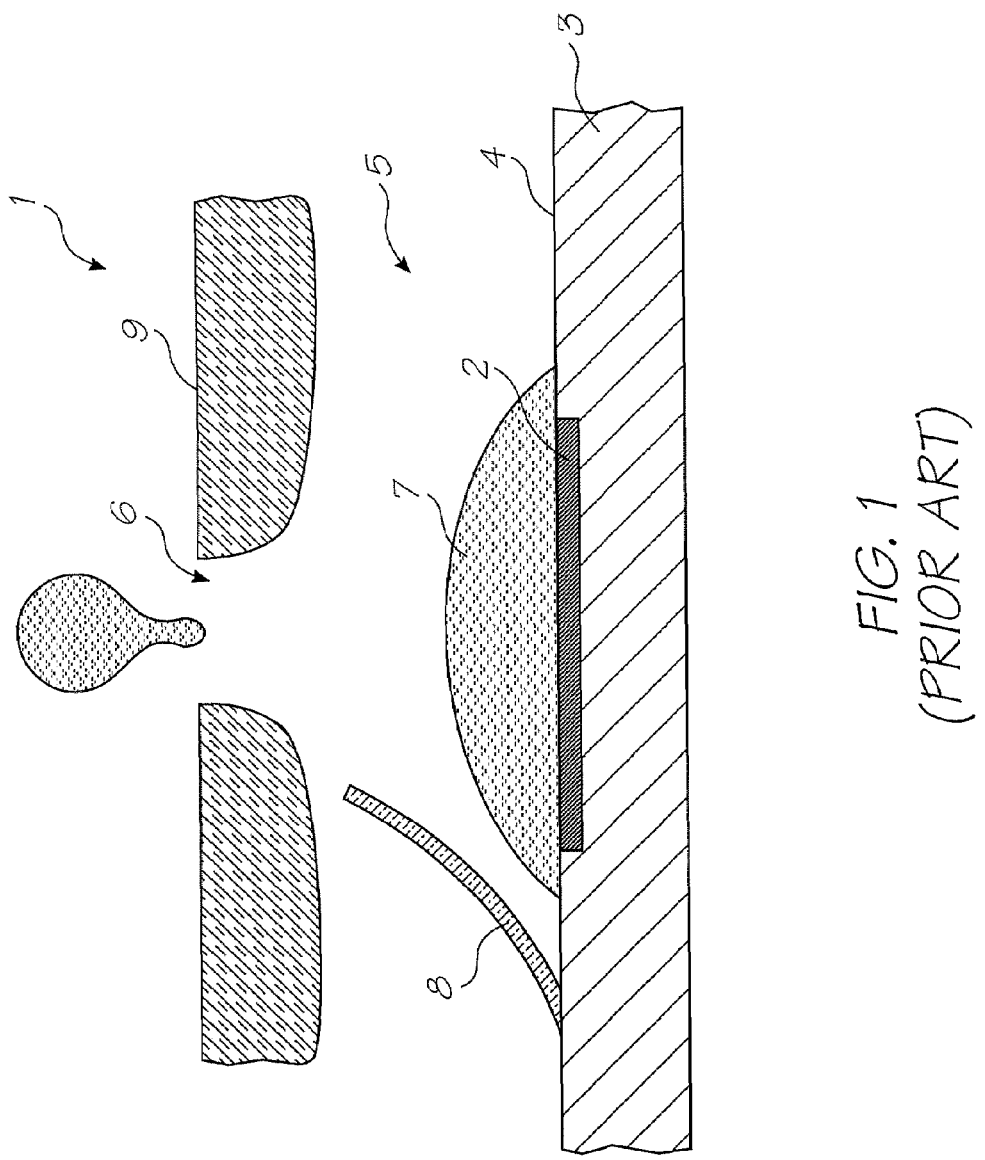
FIG. 1 shows a schematic view of a prior art apparatus that incorporates a back flow prevention mechanism.
Figure 2:
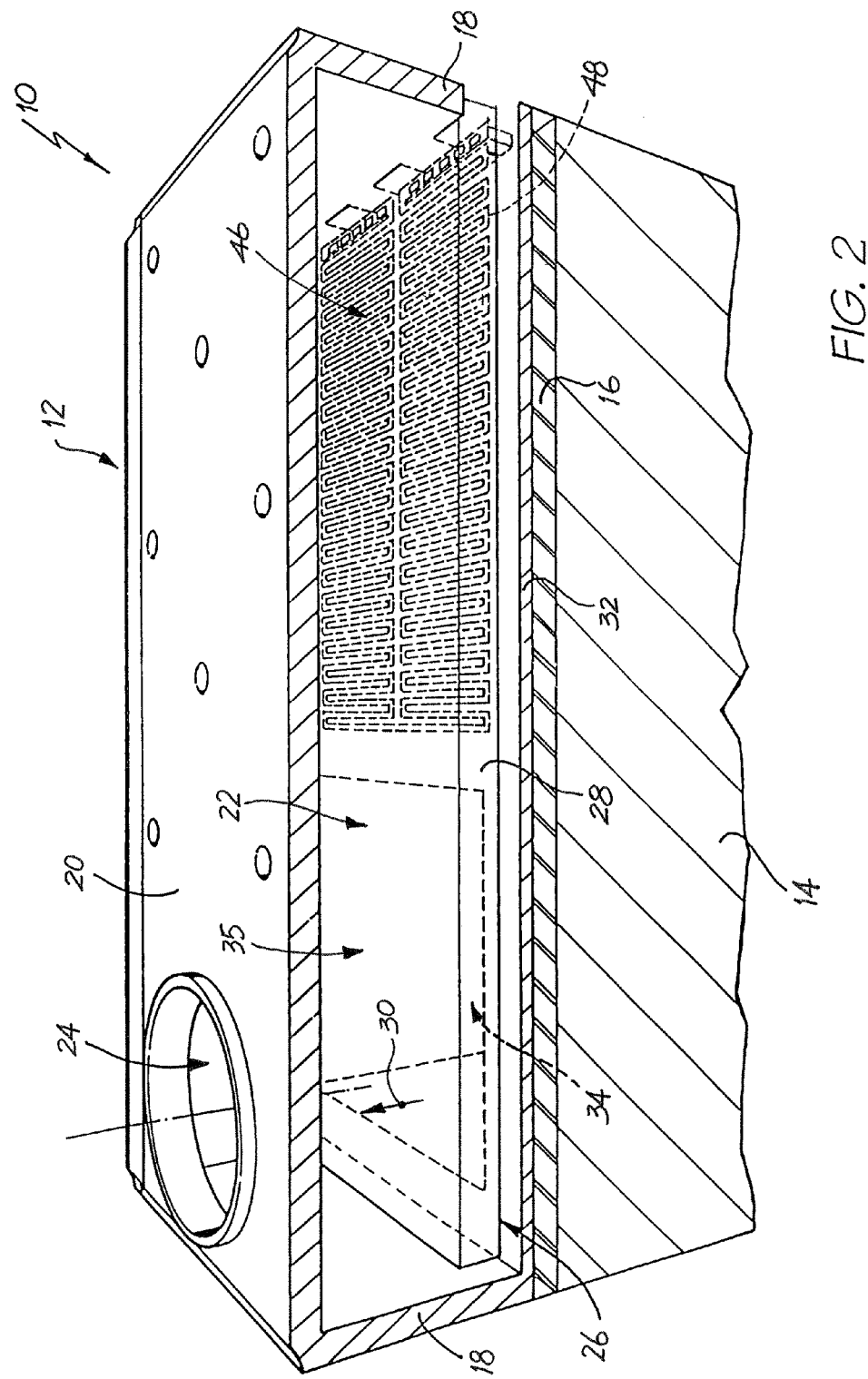
FIG. 2 shows a schematic side sectioned view of part of a first embodiment of an ink jet printhead, in accordance with the invention, showing a nozzle arrangement of the printhead.

The printhead shown in FIG. 1 has already been described under the heading "Background to the Invention" above.

In FIGS. 2 to 5, reference numeral 10 generally indicates part of a first embodiment of a printhead, in accordance with the invention, incorporating a plurality of nozzle arrangements 12.

The printhead 10 is manufactured using an integrated circuit fabrication technique. In particular, the printhead 10 is manufactured to define a micro electro-mechanical system. Details of the manufacturing process are set out in the cross-referenced applications and are therefore not described in any detail in this specification. Further, it is to be appreciated that, although the following description is directed to one or two nozzle arrangements 12, the printhead 10 can incorporate up to 19 000 of the nozzle arrangements. This has been done for purposes of clarity and ease of description.

The printhead 10 includes a wafer substrate 14. A drive circuitry layer 16 is positioned on the wafer substrate 14 and incorporates drive circuitry for connection to the nozzle arrangements 12.

Each nozzle arrangement 12 includes two pairs of opposed side walls 18 and a roof wall 20 to define a nozzle chamber 22. Each roof wall 20 has an ink ejection port 24 defined therein.

An actuator 26 is positioned in each nozzle chamber 22. Each actuator 26 includes an ink displacement member or paddle 28 which is displaceable, in the direction of an arrow 30, towards the ink ejection port 24 to eject ink from the ink ejection port 24.

A passivation layer 32 is positioned on the drive circuitry layer 16.

A plurality of ink inlet channels 34 are defined through the wafer substrate 14, the drive circuitry layer 16 and the passivation layer 32 so that an ink inlet channel 34 is in fluid communication with each nozzle chamber 22, via an inlet 35.

Figure 3:
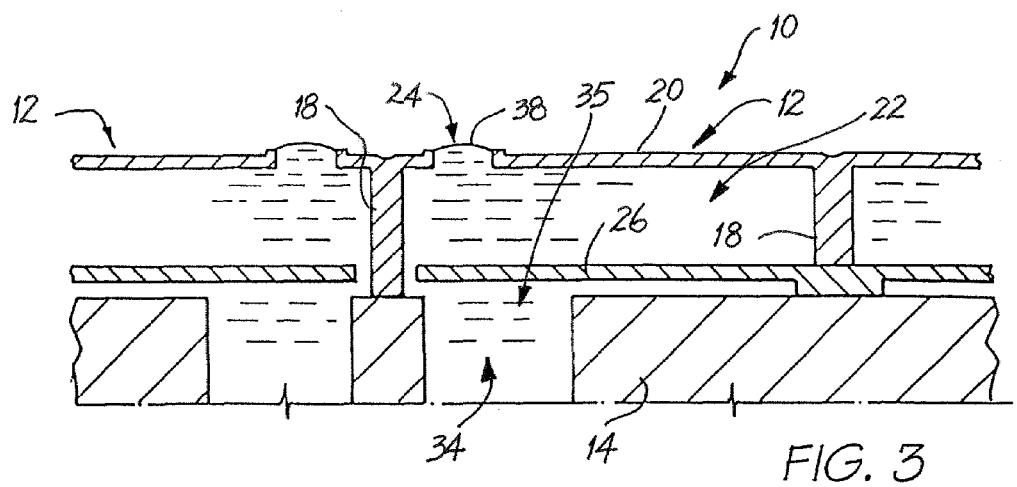
FIG. 3 shows a schematic side view of the printhead with a nozzle arrangement in a quiescent condition.
Figure 4:
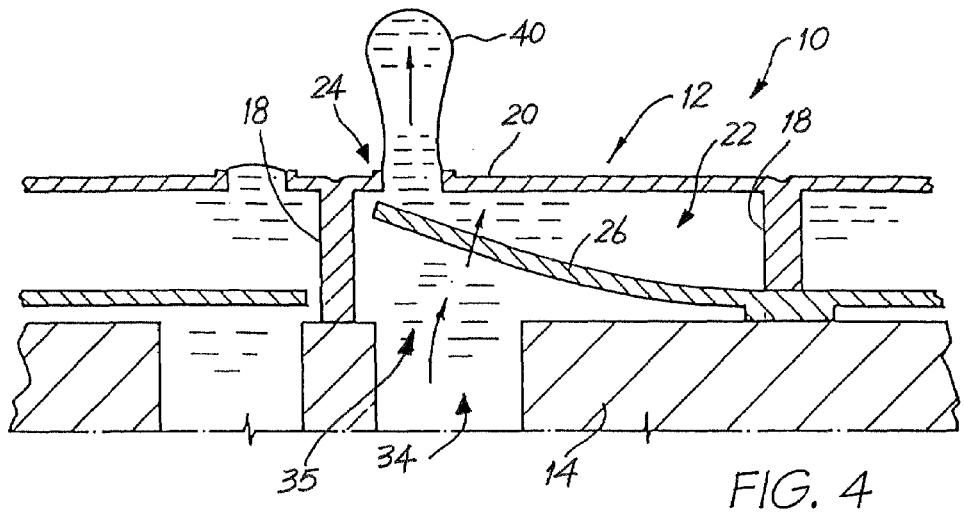
FIG. 4 shows the nozzle arrangement of FIG. 1 in the process of ejecting a drop of ink from a nozzle chamber of the nozzle arrangement.
Figure 5:
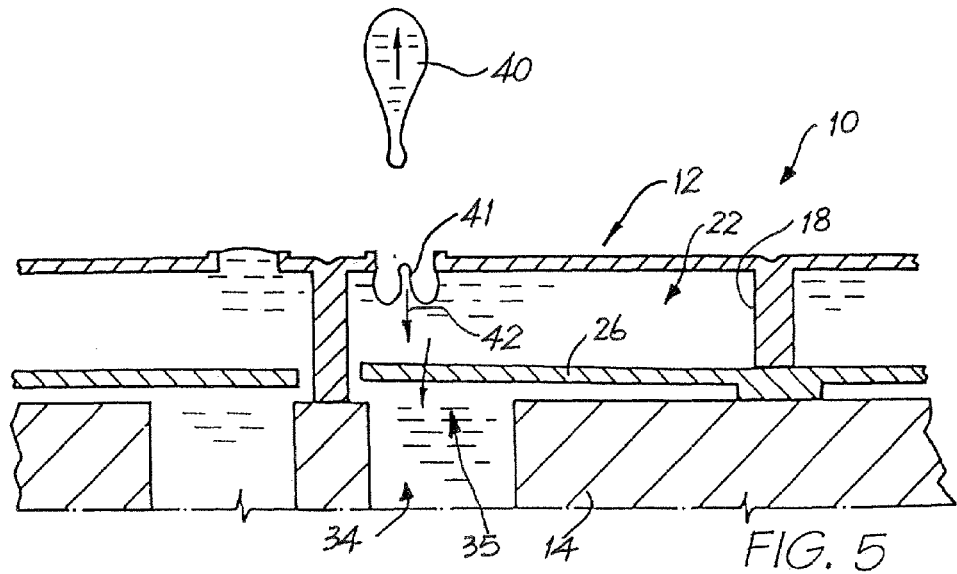
FIG. 5 shows the nozzle arrangement of FIG. 1 immediately after the ink drop has been ejected.

Operation of the actuator 26 is schematically illustrated in FIGS. 3 to 5.

A quiescent stage of the actuator 26 is shown in FIG. 3. In this stage, the ink inlet channels 34 and the nozzle chambers 22 are filled with ink 36 which also defines a meniscus 38 at the ink ejection port 24. Upon actuation, the paddle 28 is driven towards the ink ejection port 24 as shown in FIG. 3. This results in the formation of a drop 40. At this stage, the drop 40 is in fluid communication with the ink 36 within the nozzle chamber 28 and the ink inlet channel 34.

Eventually, as a result of the momentum of the ink 36, the drop 40 is necked and separates from the ink 36 within the nozzle chamber 22 and ink inlet channel 34. As can be seen in FIG. 5, a portion 41 of the ink that was ejected from the chamber 22 is drawn back into the chamber 22 as a result of surface tension effects. This has the tendency to set up a back flow of ink in the direction of an arrow 42, which is highly undesirable, as set out above. As can clearly be seen from the drawings, the paddle 28 remains in a region between the ink inlet 35 and the ink ejection port 24, thereby obstructing the back flow.

As can be seen in FIG. 3, the paddle 28 is dimensioned to correspond generally with a cross sectional dimension of the nozzle chamber 22. In particular, each paddle 28 is dimensioned so that, when the paddle 28 is at rest, the paddle 28 covers the ink inlet 35.

As a result of the fact that the paddle 28 covers the inlet 35 when at rest, the back flow of ink into the ink inlet channel 34 is inhibited by the paddle 28. This results in the ink 36 within each of the ink inlet channels 34 remaining relatively quiescent subsequent to drop ejection.

Furthermore, this allows the nozzle chamber 22 to re-fill in a stable manner.

The actuator 26 includes an actuating mechanism 46 in the form of a heater element 48 embedded in a material having a coefficient of thermal expansion which is such that work can be performed as a result of expansion of the material. In this particular example, the material is of a polytetrafluoroethylene (PTFE). The heating element 48 is connected to drive circuitry within the drive circuitry layer 16 so that operation of the actuator 26 can be controlled with a suitable control system via the drive circuitry within the drive circuitry layer 16.

Details of the operation and structure of the actuator 26 are clearly set out in the above cross-referenced applications. Accordingly, these will not be described in any detail in this specification.

Figure 6:
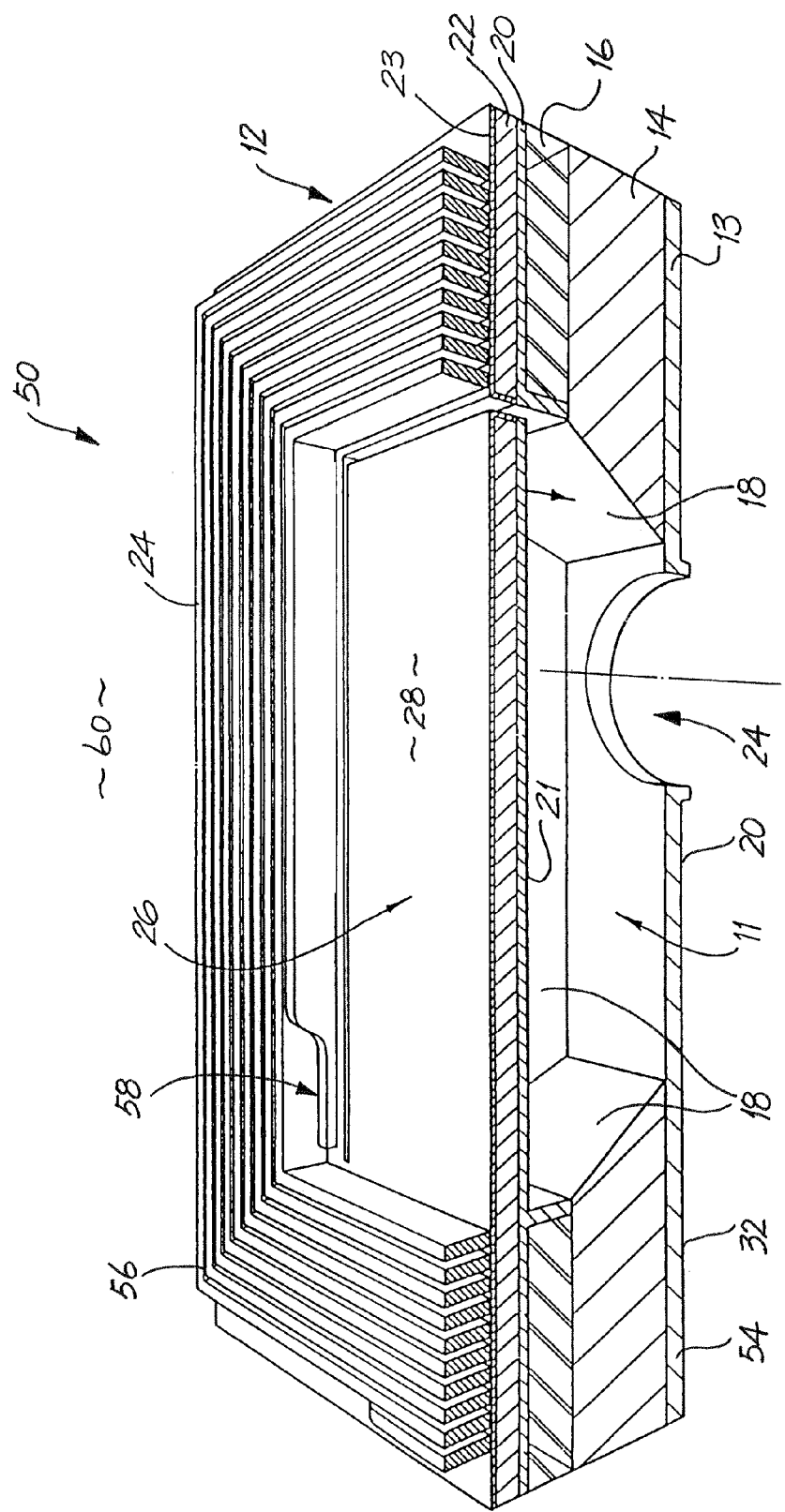
FIG. 6 shows a schematic side view of part of a second embodiment of a printhead, in accordance with the invention, showing a nozzle arrangement of the printhead.

In FIG. 6, reference numeral 50 generally indicates part of a second embodiment of a printhead, also in accordance with the invention, which incorporates a plurality of nozzle arrangements 52, one of which is shown in FIG. 6. With reference to FIGS. 1 to 4, like reference numerals refer to like parts, unless otherwise specified.

In the printhead 50, each nozzle chamber 22 is formed in what is primarily an etching process in the wafer substrate 14. A silicon nitride layer 54 is formed on the wafer substrate 14 to define the roof wall 20.

Details of the manufacture of the printhead 50 are clearly set out in the cross-referenced applications. It follows that these details will not be described in any detail in this specification.

Instead of being thermally actuated, the actuator 26 includes a magnetic field generator in the form of a coil 56 which is formed on the drive circuitry layer 16. The paddle 28 is of a material which is responsive to a magnetic field and which is displaceable on the application of a magnetic field of sufficient strength.

The printhead 50 does not incorporate the separate ink inlet channels 34 extending through the wafer substrate 14. However, each nozzle arrangement 52 includes an ink inlet opening 58 from which ink in a reservoir, indicated at 60, can pass into the nozzle chamber 22.

It will readily be appreciated that the positioning of the paddle 28, in this particular example, inhibits the back flow of ink through the opening 58 once an ink drop has been ejected from the nozzle arrangement 52, in the manner described earlier.

Figure 7:
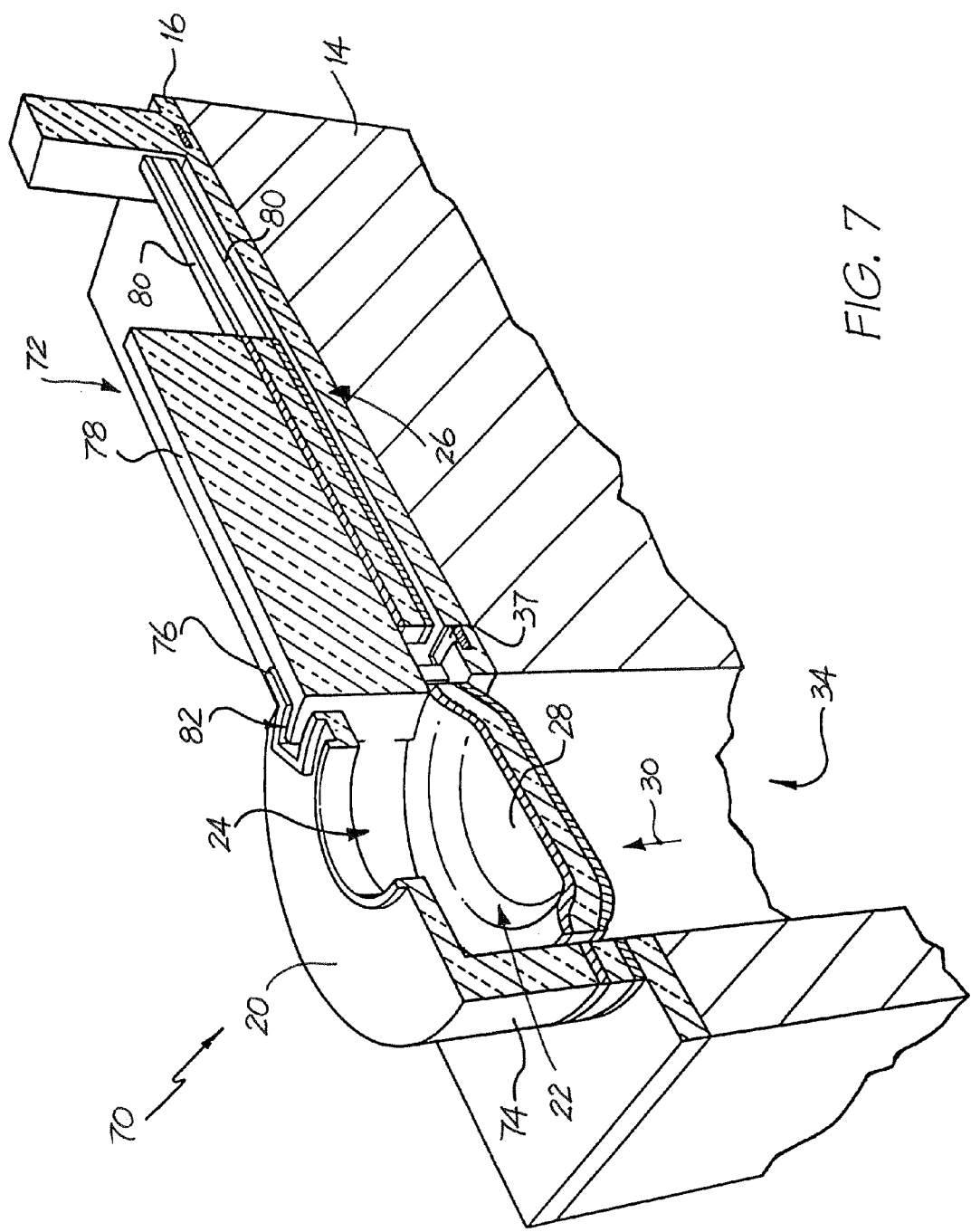
FIG. 7 shows a schematic, side sectioned view of part of a third embodiment of a printhead, in accordance with the invention, indicating cross sectional detail of a nozzle arrangement of that printhead.

In FIG. 7, reference numeral 70 generally indicates part of a third embodiment of a printhead, also in accordance with the invention, incorporating a plurality of nozzle arrangements, one of which is shown at 72. With reference to FIGS. 2 to 6, like reference numerals refer to like parts, unless otherwise specified.

The nozzle arrangement 72, for the purposes of this invention, is substantially the same as the nozzle arrangement 12.

The nozzle arrangement 72 has a different overall configuration to the nozzle arrangement 12. However, the principle of operation is, again for the purposes of this invention, substantially the same. In particular, as can be seen in FIG. 7, the paddle 28 is restrained to move in a path that remains between the ink ejection port 24 and the inlet 35. This is achieved primarily by having each ink inlet channel 34 and each respective ink ejection port 24 positioned on a common generally linear path with the paddle 28 in that path.

Further, a side wall 74 of each nozzle arrangement 72 defines a guide formation 76. The actuator 26 includes an actuator arm 78 mounted on a thermal actuator 80 to drive the actuator arm 78 towards and away from the substrate 14. The actuator arm 78 has a complementary guide formation 82 which engages the guide formation 76. The formations 76, 82 are shaped so that movement of the paddle 28 is constrained to a generally linear path between the ink inlet 35 and the ink ejection port 24.

Figure 8:
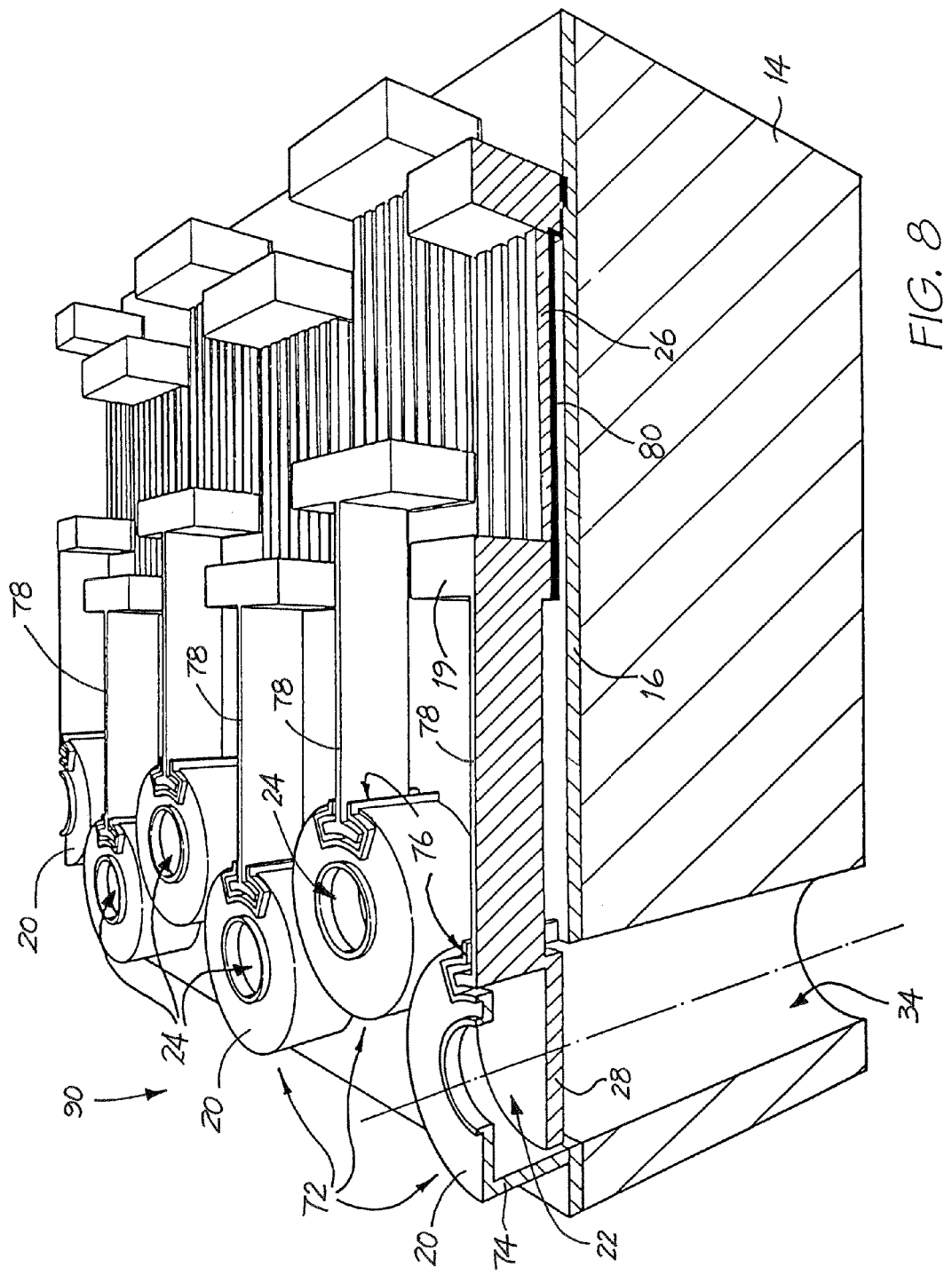
FIG. 8 shows a schematic, side sectioned view of part of a fourth embodiment of a printhead, in accordance with the invention.

In FIG. 8, reference numeral 90 generally indicates part of a fourth embodiment of a printhead, in accordance with the invention. With reference to FIGS. 2 to 7, like reference numerals refer to like parts, unless otherwise specified.

Figure 9:
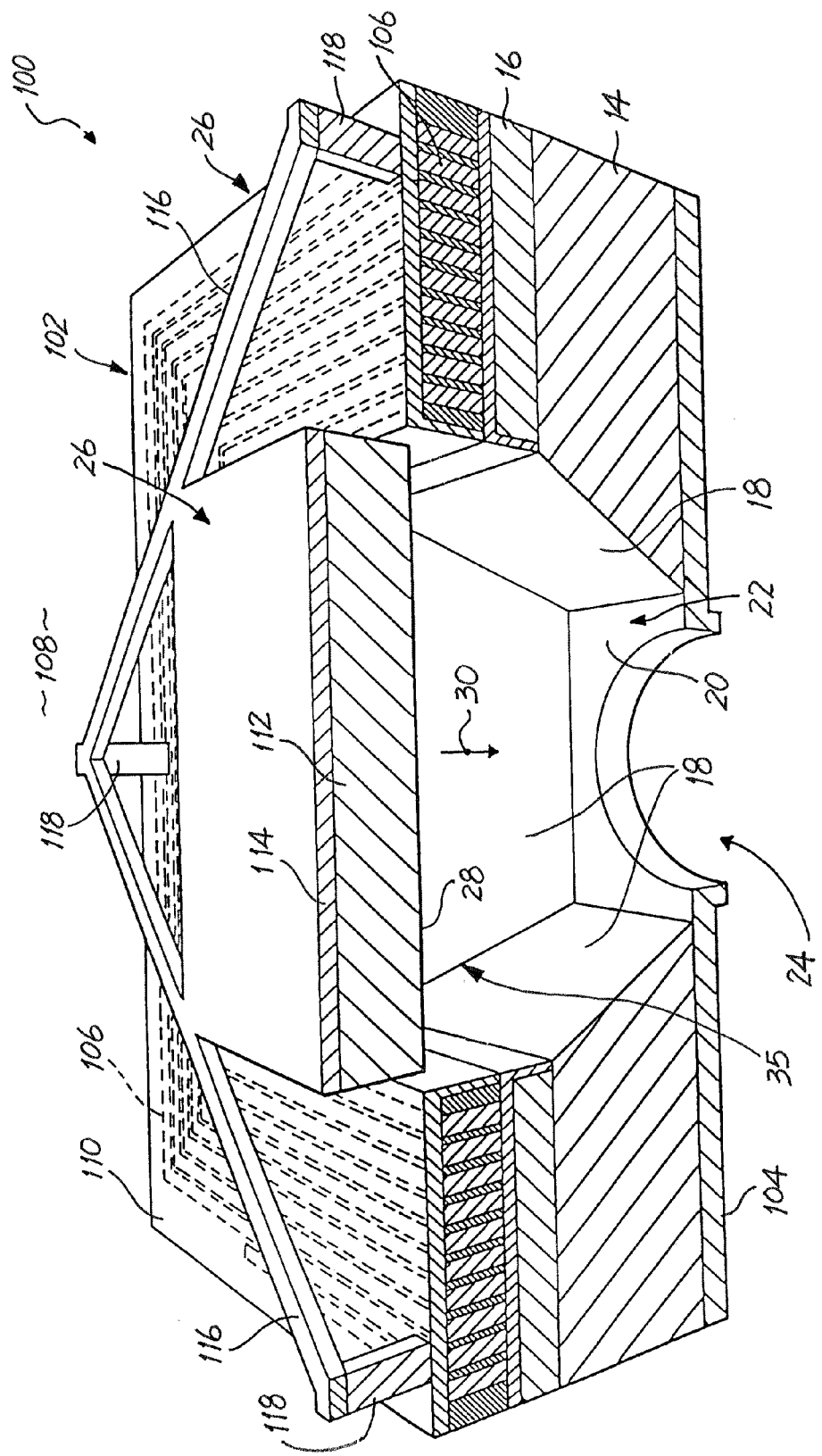
FIG. 9 shows a schematic, side sectioned view of part of a fifth embodiment of a printhead, in accordance with the invention, indicating cross sectional detail of a nozzle arrangement of that printhead.
Figure 10:
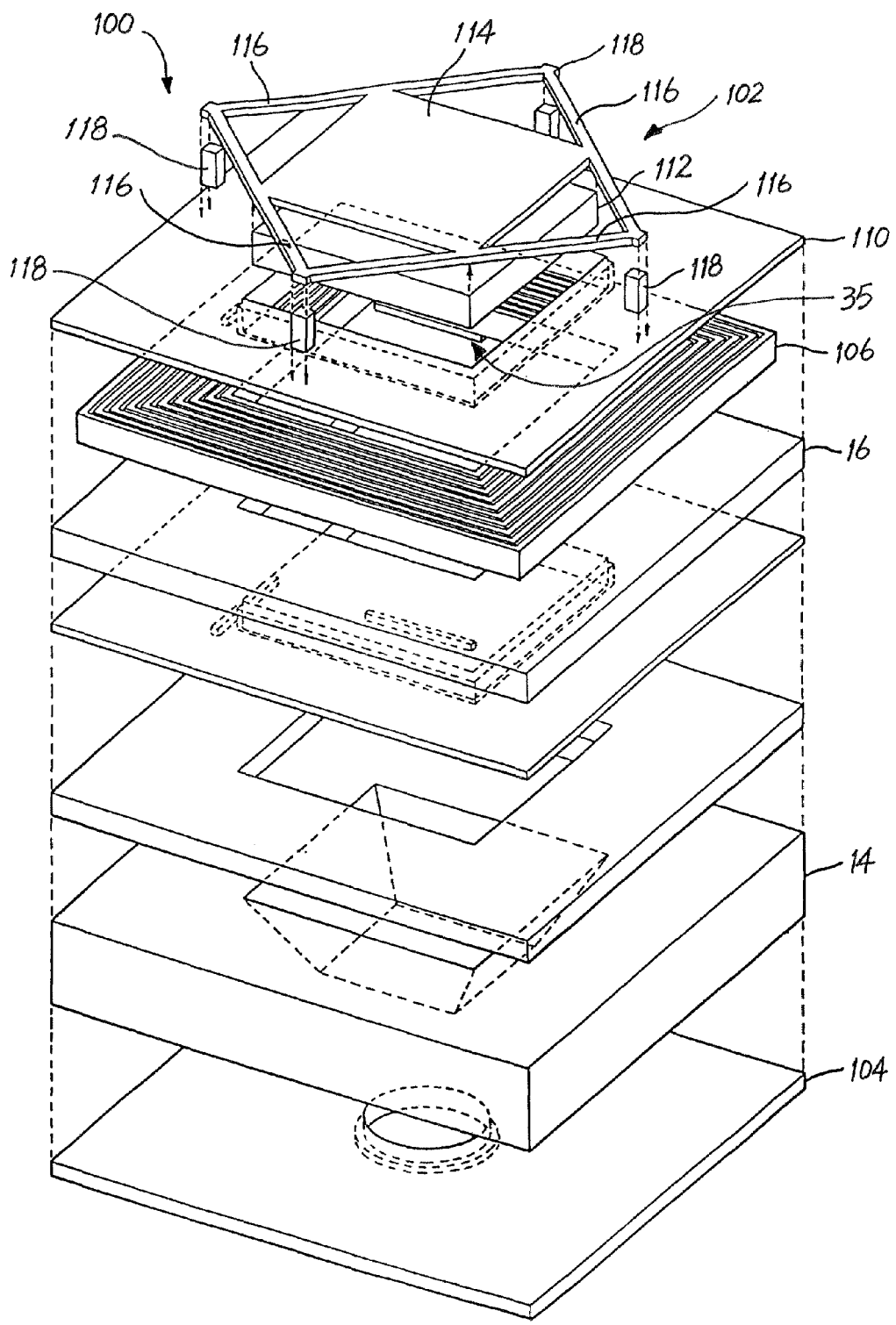
FIG. 10 shows a schematic, exploded view of a nozzle arrangement of FIG. 9.

In FIGS. 9 and 10, reference numeral 100 generally indicates part of a fifth embodiment of a printhead, in accordance with the invention. With reference to FIGS. 2 to 8, like reference numerals refer to like parts, unless otherwise specified.

The printhead 100 includes a plurality of nozzle arrangements, one of which is indicated at 102. The nozzle chamber 22 of each nozzle arrangement 102 is defined in the wafer substrate 14. In particular, each nozzle chamber 22 is formed in an etching process carried out on the wafer substrate 14. A passivation layer 104 is formed on the substrate 14, to define the roof wall 20 and the ink ejection port 24 of each nozzle chamber 22.

The printhead 100 does not incorporate a plurality of inlet channels. Rather, the inlet 35 is in fluid communication with an ink reservoir 108.

In this example, the actuator 26 includes a magnetic field generator in the form of an electrical coil 106 positioned about the inlet 35 of the nozzle chamber 22. The electrical coil 106 is coated with a passivation layer 110. The electrical coil 106 is connected to the drive circuitry of the drive circuitry layer 16 so that, when required, the coil 106 can be activated to generate a magnetic field.

The paddle 28 is dimensioned so that, when the paddle 28 is received in the inlet 35, the paddle 28 serves to close the inlet 35. The paddle 28 is movable between an open position in which the paddle 28 is spaced from the inlet 35 to permit the ingress of ink into the nozzle chamber 22 and a closed position in which the paddle 28 is received in the inlet 35 to close the inlet 35.

The paddle 28 is of a magnetic material 112 and is also coated with a passivation layer 114. Thus, the paddle 28 can be displaced when the coil 106 is activated. It follows that, by energizing the coil 106 to a certain degree, the paddle 28 can be urged into the closed position while ejecting ink from the nozzle chamber 22. It will therefore be appreciated that back flow is inhibited in this case since the inlet 35 is closed by the paddle 28 when the paddle 28 moves to eject ink from the ink ejection port 24.

Each nozzle arrangement 102 includes two pairs of opposed bridge members 116 which are mounted in a position spaced from the passivation layer 110 via two pairs of opposed support posts 118. Each paddle member 28 is connected to the bridge members 116. The bridge members 116 are configured so that each paddle member 28 is supported in the open position. The bridge members 116 are of a resilient material so that the paddle 28 acts against a tension in the bridge members 116 when it moves into the closed position. The bridge members 116 therefore serve to drive the paddle 28 back into the open position when the electrical coil 106 is de-activated.

Figure 11:
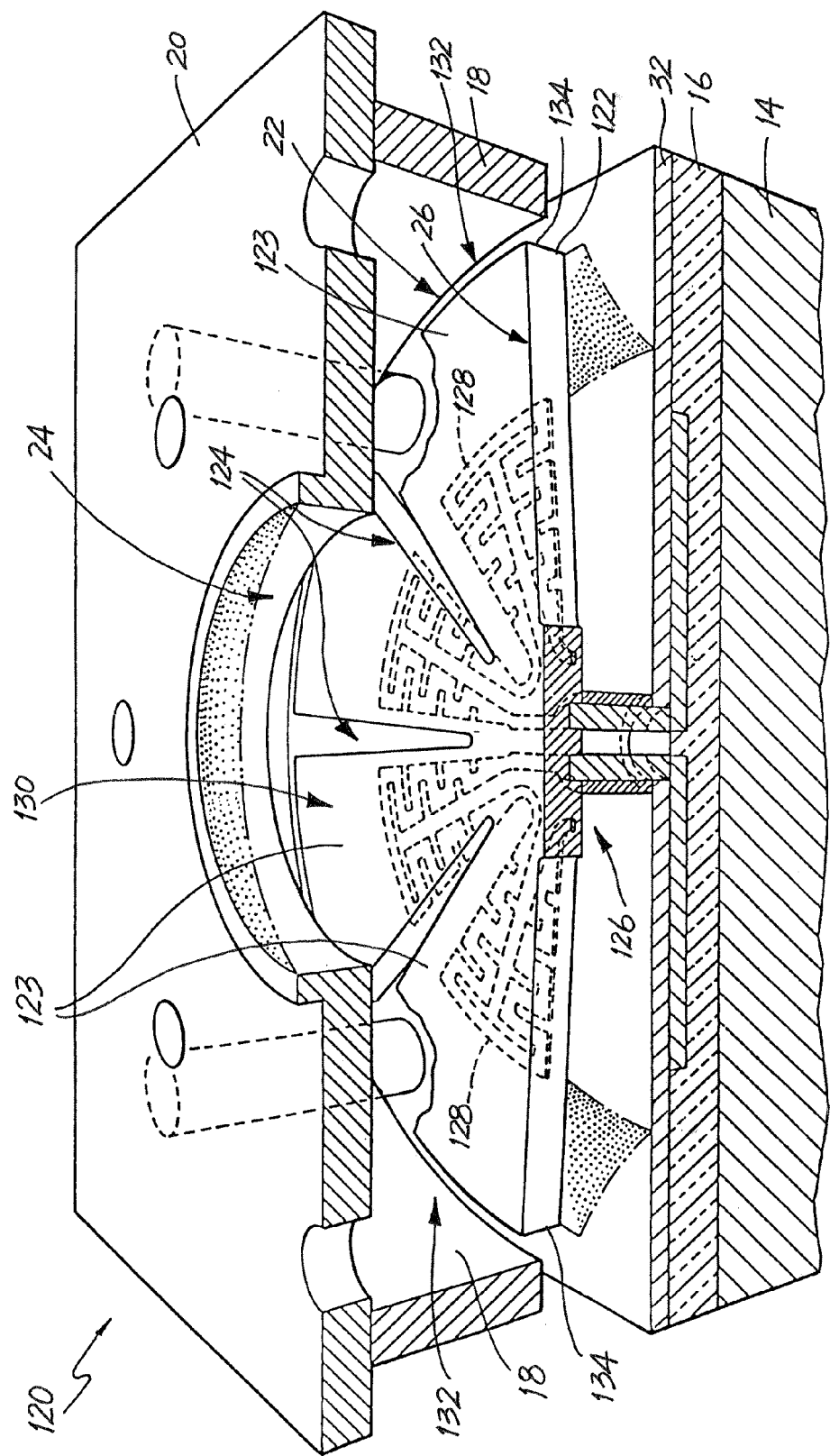
FIG. 11 shows a schematic, exploded view of part of a sixth embodiment of a printhead, in accordance with the invention, indicating cross sectional detail of a nozzle arrangement of that printhead.
Figure 12:
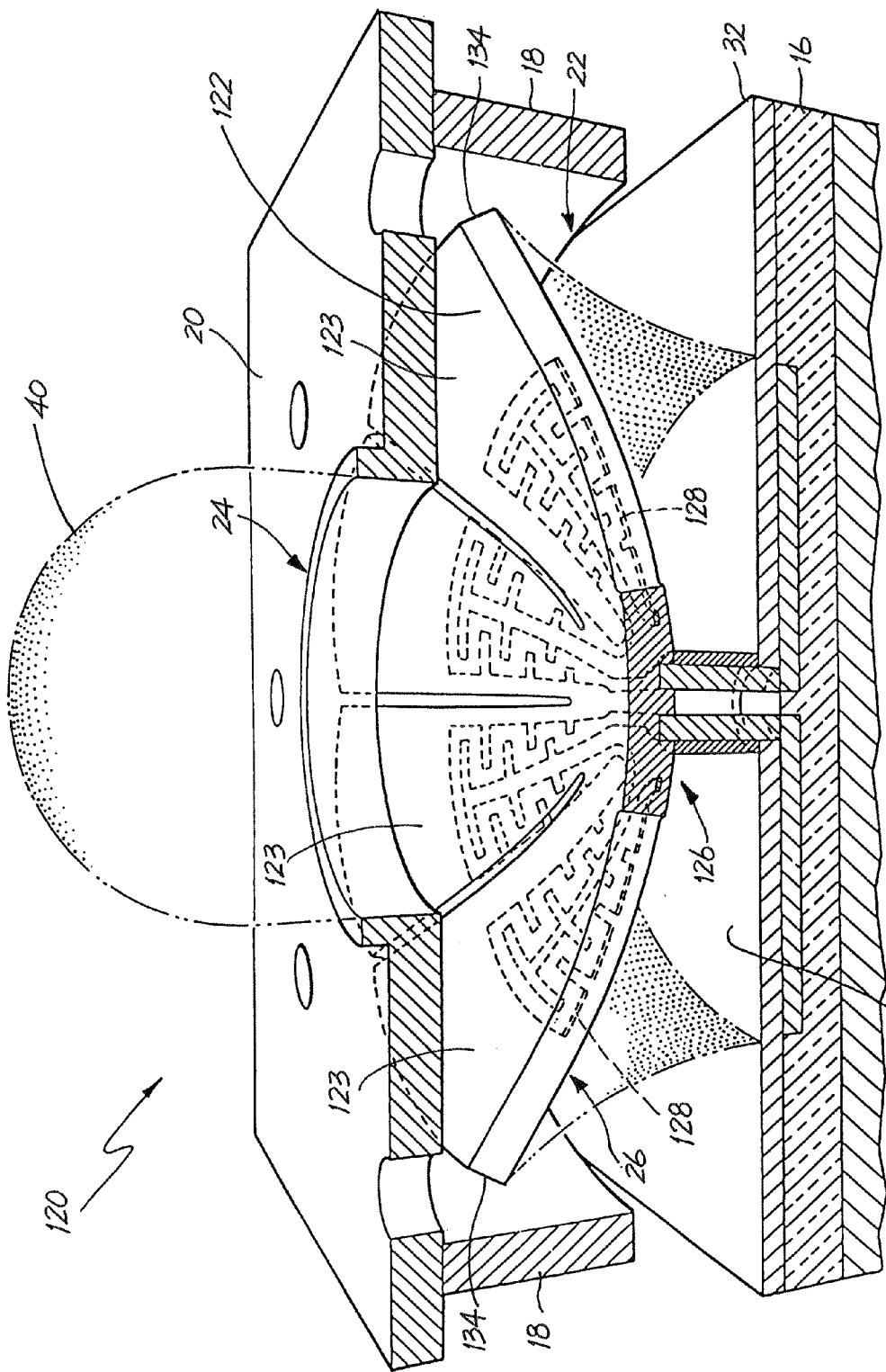
FIG. 12 shows a schematic view of a nozzle arrangement of the printhead of FIG. 11 in an operative condition.

In FIGS. 11 and 12, reference numeral 120 generally indicates part of a sixth embodiment of a printhead, in accordance with the invention. With reference to FIGS. 2 to 10, like reference numerals refer to like parts, unless otherwise specified.

In this embodiment, the actuator 26 includes an ink displacement member in the form of a segmented disc 122. The segmented disc 122 is of a material having a coefficient of thermal expansion which is such that the material can expand to do work when heated to a sufficient extent. The disc 122 has a number of segments 123 which are circumferentially spaced. A wedge-shaped gap 124 is defined between consecutive segments 123. A central portion 126 of the disc 122 is anchored to the drive circuitry layer 16.

In FIG. 11, the actuator 26 is in a rest position with the segments 123 generally parallel to the substrate 14. In FIG. 12, the segments 123 of the actuator 26 are bent towards the ink ejection port 24 so that a portion of the ink 36 that is positioned between the disc 122 and the ink ejection port 24 is ejected from the ink ejection port 24. The wedge shaped gaps 124 accommodate this movement so that buckling of the disc 122 is avoided.

A heater element 128 is positioned in each segment 123. In particular, each heater element 128 is positioned in a portion of each segment 123 distal with respect to the ink ejection port 24. Resultant uneven heating of each segment 123 causes each segment 123 to be bent towards the ink ejection port 24.

As can be seen in FIG. 11, when the disc 122 is at rest, ink is permitted to flow into a region 130 between the disc 122 and the ink ejection port 24 via a space 132 defined between a periphery 134 of the disc 122 and the roof wall 20. However, as can be seen in FIG. 12, this space 132 is effectively closed when the segments 123 are bent towards the ink ejection port 35, as described above. This serves to inhibit the flow of ink through the space 132 away from the ink ejection port 35, which, in this case, would constitute back flow.

Figure 13:
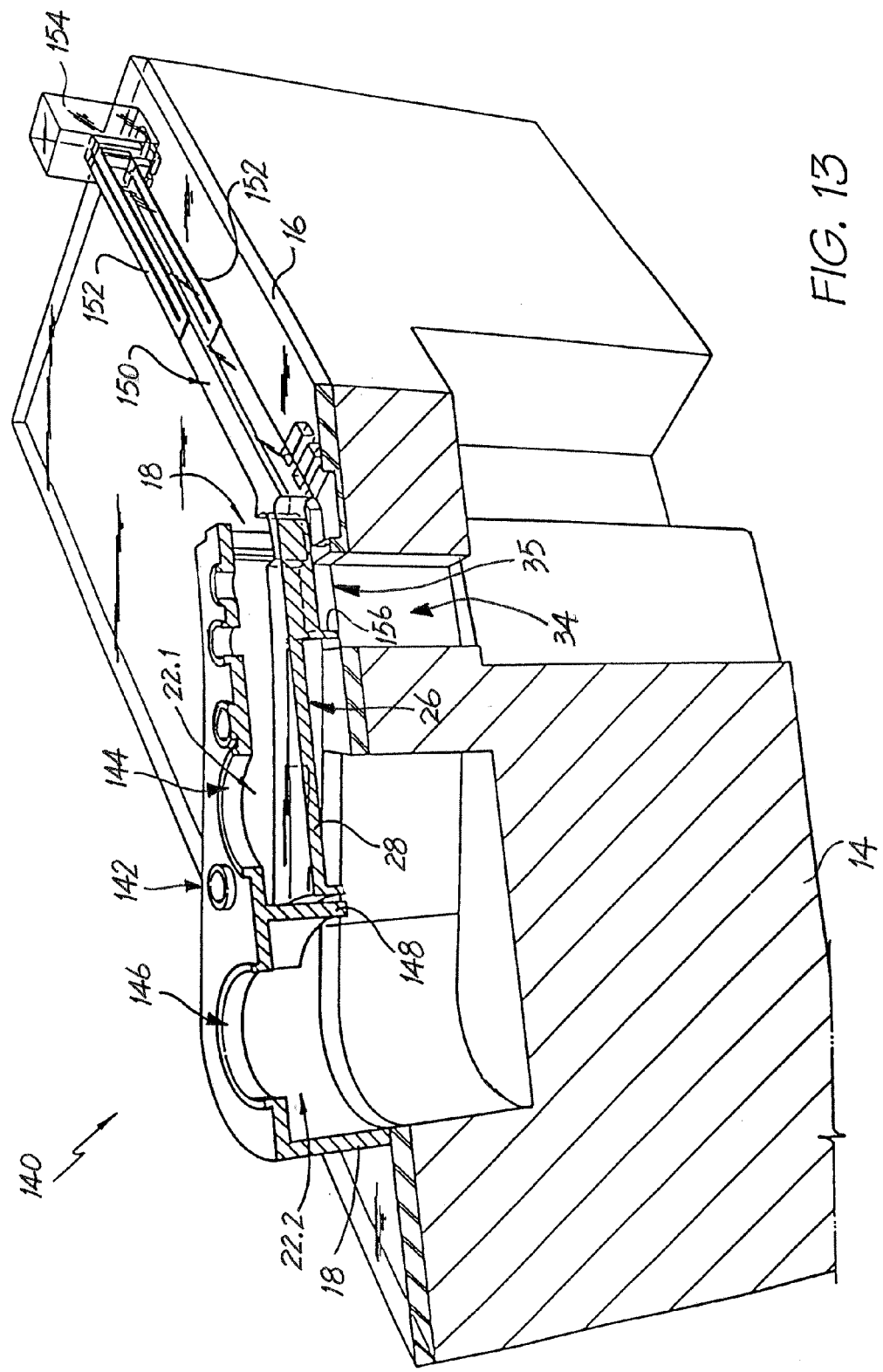
FIG. 13 shows a schematic, cross sectioned view of part of a seventh embodiment of a printhead, in accordance with the invention.

In FIG. 13, reference numeral 140 generally indicates part of a seventh embodiment of an ink jet printhead, in accordance with the invention. With reference to FIGS. 2 to 12, like reference numerals refer to like parts, unless otherwise specified.

The ink jet printhead 140 includes a plurality of nozzle arrangements, one of which is indicated at 142, arranged on the substrate 14. The roof wall 20 of each nozzle arrangement defines a pair of ink ejection ports 144, 146. A partition wall 148 extends from the roof wall 20 so that the nozzle chamber 22 is divided into a first part 22.1 and a second part 22.2. The ink ejection port 144 is in fluid communication with the first part 22.1 and the ink ejection port 146 is in fluid communication with the second part 22.2. The ink inlet 35 is in fluid communication with the first part 22.1.

The paddle 28 extends through one of the side walls 18 defining the nozzle chamber 22 and into the first part 22.1. The paddle 28 is connected to an actuator arm 150 which, in turn, is connected to a double acting thermal actuator 152. The thermal actuator 152 is fast with a support post 154, which provides a connection for the actuator 152 to the drive circuitry of the drive circuitry layer 16. The actuator 152 is configured so that, when activated, the actuator can drive the actuator arm 150 towards or away from the substrate 14.

The paddle 28 can thus be driven towards or away from the roof wall 20. The parts 22.1 and 22.2 are in fluid communication so that, when the paddle 28 is driven towards the roof wall 20, ink is ejected from the ejection port 144 and when the paddle 28 is driven away from the roof wall 20, ink is ejected from the ejection port 146.

As can be seen in FIG. 13, the paddle 28 extends over the inlet 35. Thus, when the paddle is driven towards and away from the roof wall 20, back flow of ink from the part 22.1 is inhibited in a manner which has already been described.

It will be appreciated that a flow path for ink to the second part 22.2 is defined between the paddle 28 and the substrate 14. An obstructing formation 156 is defined on the paddle 28 to extend into the inlet channel 34. The formation 156 is dimensioned and positioned on the paddle 28 so that, when the paddle 28 is driven away from and towards the roof wall 20, the formation 156 remains in a position in which it obstructs the flow of ink back into the ink channel 34. Thus, back flow from the part 22.2 is inhibited.

Figure 14:
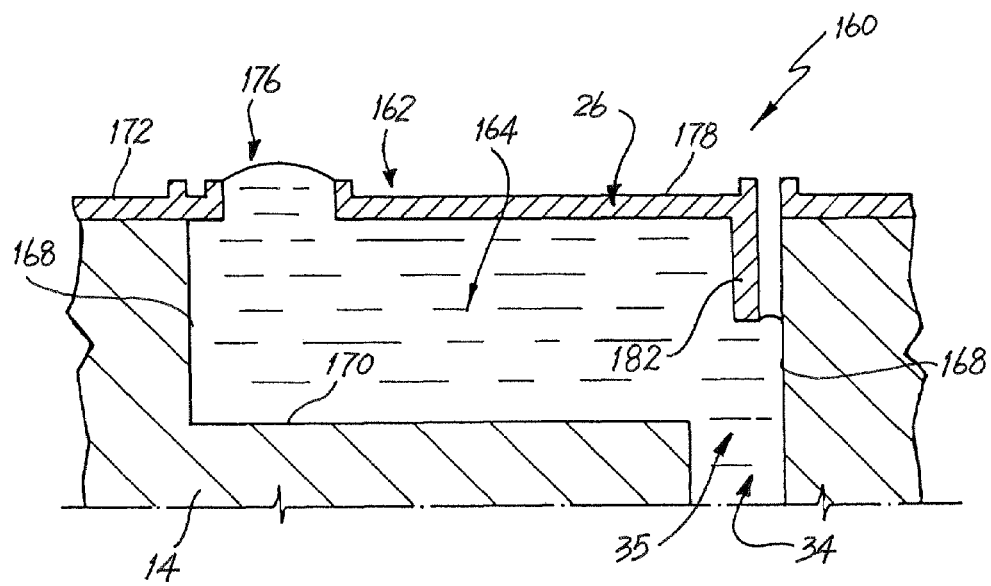
FIG. 14 shows a schematic, cross sectioned view of part of an eighth embodiment of a printhead, in accordance with the invention, in a quiescent condition.
Figure 15:
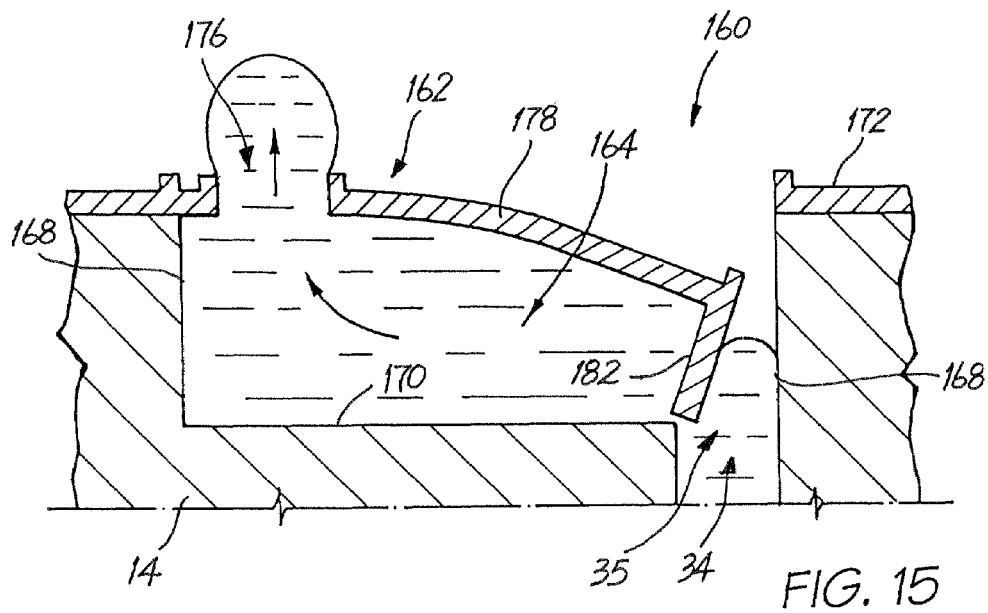
FIG. 15 shows a schematic, cross sectioned view of the printhead of FIG. 14, in an active condition.
Figure 16:
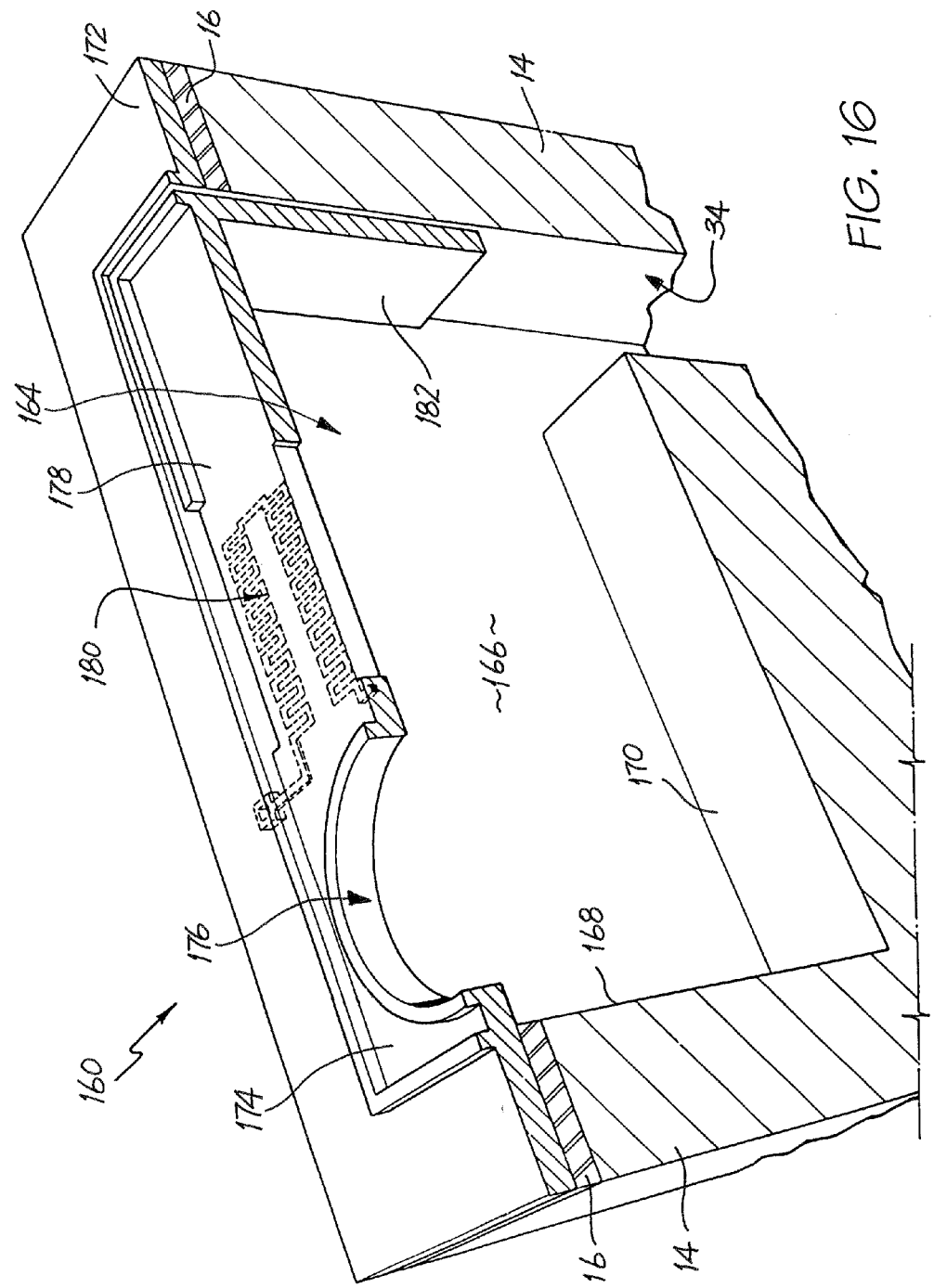
FIG. 16 shows another schematic, cross sectioned view of the printhead of FIG. 14.

In FIGS. 14 to 16, reference numeral 160 generally indicates part of a printhead, in accordance with the invention, that incorporates a nozzle arrangement 162. With reference to FIGS. 1 to 13, like reference numerals refer to like parts, unless otherwise specified.

The nozzle arrangement 162 includes a nozzle chamber 164 that is etched into the wafer substrate 14. The nozzle chamber 164 has a substantially rectangular profile, with a pair of opposed major walls 166 and a pair of opposed minor walls 168. The ink inlet channel 34 and the inlet 35 open into a floor 170 of the nozzle chamber 164 at a corner between one of the minor walls 168 and the floor 170.

A passivation layer 172 of a suitable material such as silicon nitride is positioned on the drive circuitry layer 16. In this example, a portion 174 of the passivation layer 172 extends over the nozzle chamber 164 and defines an ink ejection port 176.

The actuator 26 includes a thermal ink displacement member 178 that extends from the portion 174 to span the nozzle chamber 164. In particular, the ink displacement member 178 extends to a position adjacent one of the minor walls 168, directly above the inlet 35. The ink displacement member 178 includes a thermal actuator 180 which is configured to drive the ink displacement member 178 towards the inlet 35. This serves to reduce a volume within the nozzle chamber, thereby ejecting ink from the port 176.

An obstruction member 182 depends from the displacement member 178. The obstruction member 182 is dimensioned so that, as the ink displacement member 178 is driven into the nozzle chamber 164, the obstruction member moves into a position in which ink is obstructed from flowing into the inlet channel 34, which in this case would constitute back flow.

Operation of the nozzle arrangement 162 is shown in FIGS. 14 and 15.

Applicant submits that by incorporating a back flow prevention mechanism in the actuator 26, the back flow of ink, during and subsequent to drop ejection, can be substantially prevented. As set out earlier, this has significant advantages in the field of micro electro-mechanical systems which are used for printing.

I claim:

1. A nozzle arrangement for a printhead, the arrangement comprising:
   a wafer substrate defining a nozzle chamber;
   a passivation layer formed on the substrate to define a roof wall and ink ejection port of the chamber;
   a magnetic paddle arranged in the chamber configured to operatively eject ink from the chamber via the ejection port; and a magnetic field generator fast with the wafer substrate, the generator configured to actuate the paddle to eject the ink.

2. The nozzle arrangement of claim 1, wherein the nozzle chamber is formed during an etching process carried out on the wafer substrate.

3. The nozzle arrangement of claim 1, wherein the chamber includes an inlet arranged in fluid communication with an ink reservoir.

4. The nozzle arrangement of claim 3, wherein the magnetic field generator includes an electrical coil positioned about the inlet of the nozzle chamber.

5. The nozzle arrangement of claim 4, wherein the wafer substrate includes a drive circuitry layer with drive circuitry for providing electrical signals to the electrical coil.

6. The nozzle arrangement of claim 5, wherein the electrical coil is connected to the drive circuitry of the drive circuitry layer so that, when required, the coil can be activated to generate a magnetic field.

7. The nozzle arrangement of claim 3, wherein the paddle is dimensioned so that, when the paddle is received in the inlet, the paddle serves to close the inlet.

8. The nozzle arrangement of claim 7, wherein the paddle is movable between an open position in which the paddle is spaced from the inlet to permit the ingress of ink into the nozzle chamber and a closed position in which the paddle is received in the inlet to close the inlet.

* * * * *